United States Patent [19]

Kawakami et al.

[11] Patent Number: 5,293,004
[45] Date of Patent: Mar. 8, 1994

[54] PRINTED CIRCUIT BOARD HAVING AN ELECTROMAGNETIC SHIELDING LAYER

[75] Inventors: Shin Kawakami; Katsutomo Nikaido, both of Saitama, Japan

[73] Assignee: Nippon CMK Corp., Japan

[21] Appl. No.: 820,290

[22] Filed: Jan. 6, 1992

[30] Foreign Application Priority Data

Sep. 2, 1991 [JP] Japan .................. 3-078139[U]

[51] Int. Cl.⁵ .............................................. H05K 1/00
[52] U.S. Cl. ...................... 174/250; 174/35 R; 174/254; 174/257; 174/258
[58] Field of Search ............... 174/35 R, 250, 254, 174/257, 258; 428/901

[56] References Cited

U.S. PATENT DOCUMENTS

| | | | |
|---|---|---|---|
| 4,801,489 | 1/1989 | Nakagawa et al. | 174/35 R |
| 4,973,799 | 11/1990 | Soma et al. | 174/260 |
| 5,025,116 | 6/1991 | Kawakami et al. | 174/254 X |
| 5,030,800 | 7/1991 | Kawakami et al. | 174/35 R |
| 5,043,526 | 8/1991 | Nakagawa et al. | 174/250 |

*Primary Examiner*—Morris H. Nimmo
*Attorney, Agent, or Firm*—Bruce I. Adams; Van C. Wilks

[57] ABSTRACT

A printed wiring board includes an insulating substrate having a wiring circuit formed on at least one side thereof. An insulating layer is formed on the wiring circuit and has a plurality of individual curved openings extending therethrough to expose corresponding connection lands of a ground circuit of the wiring circuit. An electromagnetic wave shielding layer is formed on the insulating layer over a portion of the wiring circuit and electrically and mechanically connects with the ground circuit through the connection lands. The curved openings are circular, elliptical or similar shape and dimensioned to prevent formation of bubbles when forming the electromagnetic wave shielding layer thereby enhancing the electrical and mechanical connection between the electromagnetic wave shielding layer and the planar connection land. The curved openings also prevent thinning of the wave shielding layer at the connection lands so as to prevent an increase in connection resistance.

8 Claims, 1 Drawing Sheet

PRINTED CIRCUIT BOARD HAVING AN ELECTROMAGNETIC SHIELDING LAYER

BACKGROUND OF THE INVENTION

1. Field of the Invention

The present invention relates to a printed wiring board, and more particularly is directed to a printed wiring board having a shielding layer for shielding an electromagnetic wave which may cause an externally induced noise.

2. Description of the Related Arts

Conventionally, an electromagnetic waveshielding layer has been formed on a printed wiring board in order to prevent a malfunction of a wiring circuit caused by an electromagnetic wave from the outside. A printed wiring board having such an electromagnetic wave shielding layer is disclosed in Japanese Examined Utility Model Publication No. 55-29276.

As shown in FIGS. 3 and 4, an electromagnetic wave shielding layer 5 is formed through an insulating layer 3 on the front of the printed wiring circuit which is overlaid on an insulating board 1.

Also, the insulating layer 3, defines a connection land 2 which is provided on a ground circuit 4 in the printed wiring circuit, and the electromagnetic wave shielding layer 5 is electrically connected with the connection land 2 upon the formation of the electromagnetic wave shielding layer 5.

However, when forming the connection land 2 on the ground circuit 4 through the insulating layer 3 in the conventional electromagnetic wave shielding printed wiring board, the connection land 2 has an opening whose contour is not circular but square or polygonal shape which is analogous to that of the ground circuit as shown in FIG. 3. This often causes bubbles to form at the edge of the connection land 2 when forming the electromagnetic wave shielding layer 5, which leads to a problem in the connection reliability.

Also, the connection land 2 as shown in FIGS. 3 and 4 is consequently formed over a wider area, and hence the thickness of the electromagnetic wave shielding layer 5 becomes thinner in that area, which increases a connection resistance, thus leading to a reduction in the shielding effect.

The present invention was therefore conceived in view of the disadvantages in the conventional electromagnetic wave shielding printed wiring board. An objective of the present invention is to provide a printed wiring board which prevents the bubbles from entering the electromagnetic wave shielding layer in the connection land, prevents the thinning of the electromagnetic wave shielding layer on the connection land, and allows the electromagnetic wave shielding printed wiring board to effectively function.

SUMMARY OF THE INVENTION

According to the present invention, a printed wiring board is provided in which a wiring circuit made of a conductor is arranged on one side or both sides of an insulating substrate insulating board. An electromagnetic wave shielding layer is disposed on the entire surface or at a desired area of the wiring circuit through an insulating layer. The insulating layer has a plurality of individual curved openings which extend to connection lands of a ground circuit of the wiring circuit.

The electromagnetic wave shielding layer is electrically connected to the ground circuit of said wiring circuit through the connection part formed from one or a plurality of closed curve openings which may have a circular, elliptical or any shape similiar.

In the printed wiring board of the present invention, the connection land on the ground circuit is so constructed that the opening provided thereon through the insulating layer is of circular or elliptical or other similar shapes resembling these, thereby preventing the entrance of bubbles when forming the shielding layer, preventing the shielding layer on the connection land from thinning, and preventing reduction in the electromagnetic wave shielding effect caused by the increase of the connection resistance.

BRIEF DESCRIPTION OF THE INVENTION

For a better understanding of the present invention, reference will now be made by way of example to the accompanying figures, in which.

DESCRIPTION OF THE PREFERRED EMBODIMENTS

Hereinafter, an embodiment of the present invention will be described with reference to the accompanying drawings.

Figure 1:
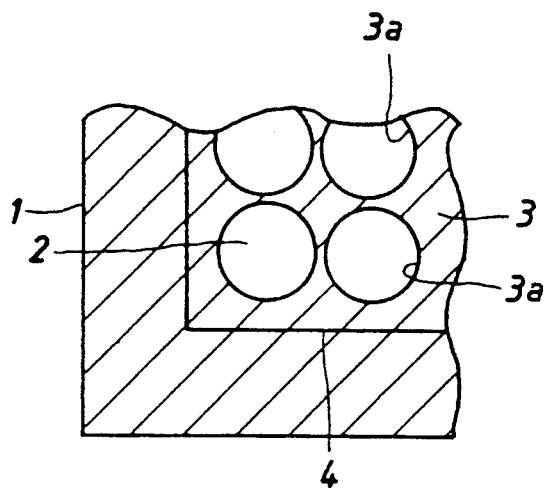
FIG. 1 is a plan view showing the configuration of the connection lands in the printed wiring board.

FIG. 1 is a plan view of a printed wiring board showing the configuration of a connection land in a ground circuit.

Figure 2:
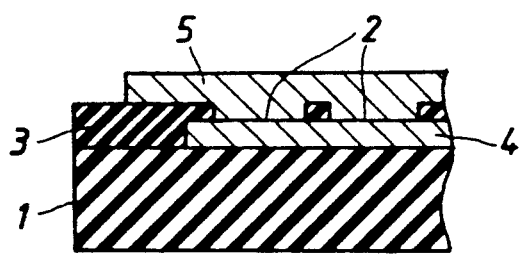
FIG. 2 is a sectional view showing the principal part of the printed wiring board.
Figure 3:
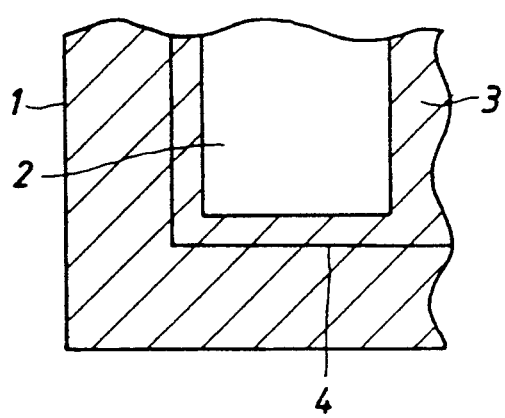
FIG. 3 is a plan view showing the configuration of the ground circuit in the conventional printed wiring board.
Figure 4:
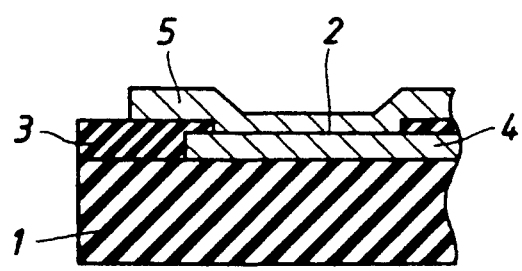
FIG. 4 is a sectional view showing the principal part of the conventional printed wiring board.

FIG. 2 is a sectional view showing the principal part of the printed wiring board.

A desired printed wiring circuit is formed on the front (or both sides including the back) of the insulating board 1 in accordance with the known method (For example, the circuit may be formed on a copper laminated board by means of etching).

Before forming an electromagnetic wave shielding layer 5 onto the printed wiring circuit, an insulating layer 3 is disposed on the printed wiring board and the electromagnetic wave shielding layer 5 is overlaid on the insulating layer 3.

Further, the electromagnetic wave shielding layer 5 is electrically connected to a ground circuit 4 and generally coated with copper paste or carbon paste by means of a screen printing method.

Particularly in this embodiment, when forming the insulating layer 3 on the printed wiring board as shown in FIG. 1, a plurality of circular openings 3a are provided on the ground circuit 4 to form a plurality of circular connection lands 2.

The electromagnetic wave shielding layer 5 is thus formed having an electrical connection through the plurality of connection lands 2 of the ground circuit 4.

Incidentally, the shape of the connection lands is not limited to a circle, but instead it may be an ellipse or any similiar shape.

According to the present invention, the connection lands in the ground circuit are each shaped into a circle, ellipse or any similar shape whereby the entrance of bubbles is prevented when forming the electromagnetic wave shielding layer, and the thickness of the shielding layer on the ground circuit is not permitted to thin, thus preventing the increase of the connection resistance and allowing the electromagnetic wave shield to effectively function.

What is claimed is:

1. A printed wiring board, comprising: a conductive wiring circuit formed on at least one side of an insulating board, and an electromagnetic wave shielding layer disposed over at least a desired area portion of the wiring circuit through an insulating layer, wherein said electromagnetic wave shielding layer is electrically connected to a ground circuit of said wiring circuit through a planar connection part formed from a plurality of openings of relatively small size, said openings having a circular or elliptical shape, the shape of the planar connection part being effective to prevent thinning of the wave shielding layer and to prevent the formation of bubbles when forming the electromagnetic wave shielding layer.

2. A printed wiring board, comprising: an insulating substrate having opposed sides; a ground circuit formed on at least one side of the substrate; an insulating layer formed on the ground circuit and having a plurality of individual curved openings of relatively small size extending therethrough to the ground circuit to expose corresponding connection lands of the ground circuit, the curved openings being of circular or elliptical shape and being effective to prevent the formation of bubbles when forming an electromagnetic wave shielding layer on the insulating layer to thereby enhance the electrical and mechanical connection between the electromagnetic wave shielding layer and the connection lands; and an electromagnetic wave shielding layer formed on at least a portion of the insulating layer and extending through the curved openings of the insulating layer and being electrically and mechanically connected with the ground circuit through the connection lands.

3. A printed wiring board according to claim 2; wherein the individual curved openings all have the same shape.

4. A printed wiring board according to claim 2; wherein the curved openings have a circular shape.

5. A printed wiring board according to claim 2; wherein the curved openings have an elliptical shape.

6. A printed wiring board according to claim 2; wherein the connection lands are coplanar with the remainder of the ground circuit on the substrate.

7. A printed wiring board according to claim 2; wherein the electromagnetic wave shielding layer is comprised of a copper paste.

8. A printed wiring board according to claim 2; wherein the electromagnetic wave shielding layer has a substantially planar upper surface.

* * * * *